US008940558B2

(12) United States Patent
Haensch et al.

(10) Patent No.: US 8,940,558 B2
(45) Date of Patent: Jan. 27, 2015

(54) TECHNIQUES FOR QUANTIFYING FIN-THICKNESS VARIATION IN FINFET TECHNOLOGY

(71) Applicant: International Business Machines Corporation, Armonk, NY (US)

(72) Inventors: Wilfried E. A. Haensch, Somers, NY (US); Chung-Hsun Lin, White Plains, NY (US); Philip J. Oldiges, Lagrangeville, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 13/836,478

(22) Filed: Mar. 15, 2013

(65) Prior Publication Data

US 2014/0273298 A1    Sep. 18, 2014

(51) Int. Cl.
*H01L 21/66* (2006.01)
*G01B 7/06* (2006.01)

(52) U.S. Cl.
CPC . *G01B 7/08* (2013.01); *H01L 22/12* (2013.01)
USPC ............................................. 438/17; 716/110

(58) Field of Classification Search
CPC ............ H01L 29/66795; H01L 29/785; H01L 27/0207; H01L 27/0886; H01L 27/0924; H01L 27/1211; H01L 21/14; H01L 21/823821; H01L 21/82385; H01L 21/845; G01B 7/06; G01B 7/08; G01B 2210/56
USPC ........ 716/110–131; 438/14–18; 702/117–120
See application file for complete search history.

(56) References Cited

U.S. PATENT DOCUMENTS

| 6,169,415 | B1 * | 1/2001 | Yamaguchi | 324/762.09 |
| 7,317,230 | B2 | 1/2008 | Lee et al. | |
| 7,447,606 | B2 * | 11/2008 | Agarwal et al. | 702/117 |
| 7,453,124 | B2 | 11/2008 | Adan | |
| 7,587,298 | B2 * | 9/2009 | Logan | 702/182 |
| 7,917,316 | B2 | 3/2011 | Agarwal et al. | |
| 8,188,546 | B2 | 5/2012 | Anderson et al. | |
| 2008/0224183 | A1 | 9/2008 | Nawaz | |
| 2008/0303095 | A1 | 12/2008 | Xiong et al. | |

(Continued)

OTHER PUBLICATIONS

Chung-Hsun Lin et al., "Non-Planar Device Architecture for 15nm Node: FinFET or Trigate?," 2010 IEEE International SOI Conference (SOI), pp. 1-2, Oct. 2010.

(Continued)

*Primary Examiner* — Steven J Fulk
*Assistant Examiner* — Eric Ward
(74) *Attorney, Agent, or Firm* — Vazken Alexanian; Michael J. Chang, LLC

(57) ABSTRACT

Techniques for quantifying $\Delta$Dfin in FINFET technology are provided. In one aspect, a method for quantifying $\Delta$Dfin between a pair of long channel FINFET devices includes the steps of: (a) obtaining Vth values for each of the long channel FINFET devices in the pair; (b) determining a $\Delta$Vth for the pair of long channel FINFET devices; and (c) using the $\Delta$Vth to determine the $\Delta$Dfin between the pair of long channel FINFET devices, wherein the $\Delta$Vth is a function of a difference in a Qbody and a gate capacitance between the pair of long channel FINFET devices, and wherein the Qbody is a function of Dfin and Nch for each of the long channel FINFET devices in the pair, and as such the $\Delta$Vth is proportional to the $\Delta$Dfin between the pair of long channel FINFET devices.

15 Claims, 7 Drawing Sheets

(56) References Cited

U.S. PATENT DOCUMENTS

| | | | |
|---|---|---|---|
| 2009/0174000 | A1 | 7/2009 | Ohguro |
| 2010/0249974 | A1 | 9/2010 | Fei et al. |
| 2011/0210379 | A1 | 9/2011 | El-Kareh et al. |
| 2013/0173214 | A1* | 7/2013 | Yamashita et al. ............ 702/170 |
| 2013/0263077 | A1* | 10/2013 | Baek et al. .................... 716/122 |

OTHER PUBLICATIONS

A. Borna et al., "Correlation analysis of CD-variation and circuit performance under multiple sources of variability," Proceedings of SPIE vol. 5756, Design and Process Integration for Microelectronic Manufacturing III, 168 (May 13, 2005).

J.P. Cain et al., "Optimum sampling for characterization of systematic variation in photolithography," Proc. SPIE 4689, Metrology, Inspection, and Process Control for Microlithography XVI, 430 (Jul. 1, 2002).

A. Ortiz-Conde et al., "A review of recent MOSFET threshold voltage extraction methods," Microelectronics Reliability 42, pp. 583-596 (Apr. 2002).

V. Narendar et al., "Threshold Voltage Control Schemes in FINFETS," International Journal of VLSI design & Communication Systems (VLSICS), vol. 3, No. 2, Apr. 2012.

M. Zakir Hossain et al., "Electrical Characteristics of Trigate Finfet," Global Journal of Researches in Engineering, Electrical and Electronics Engineering, vol. 11, Issue 7, Version 1.0, Dec. 2011.

* cited by examiner

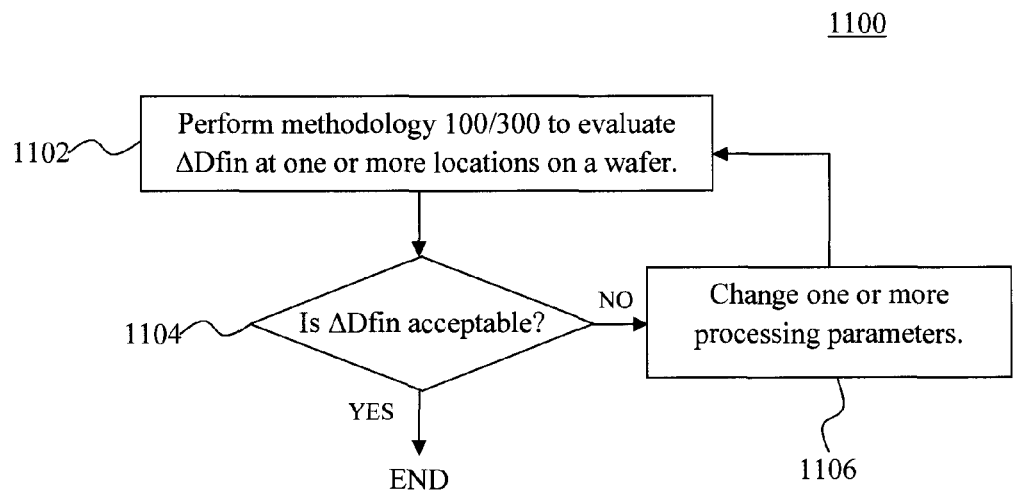
FIG. 11
FIG. 12
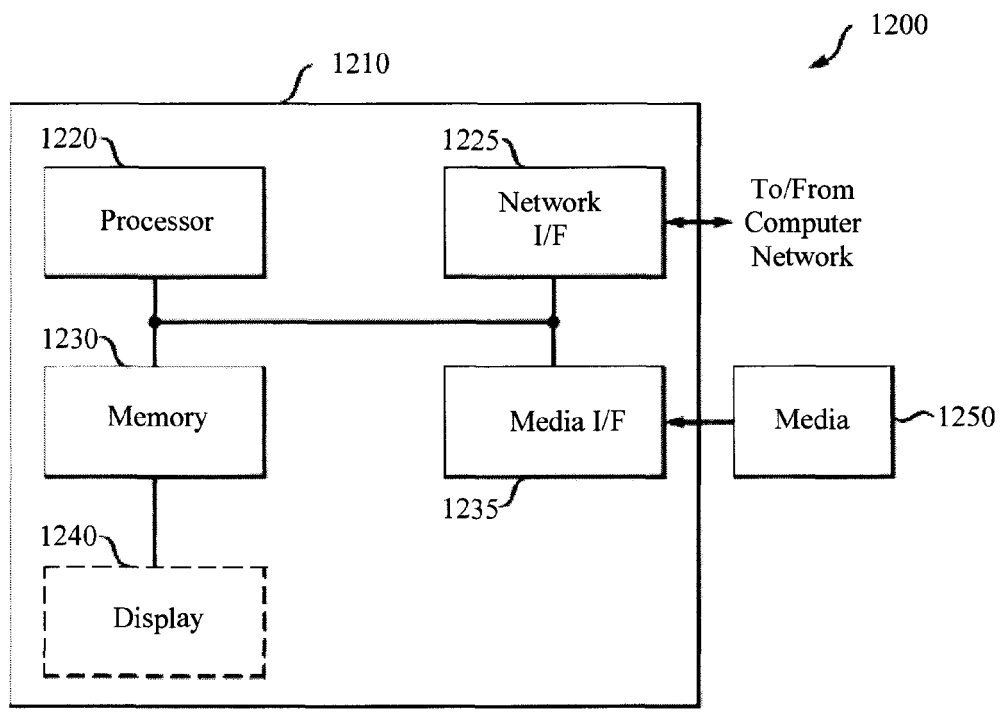

TECHNIQUES FOR QUANTIFYING FIN-THICKNESS VARIATION IN FINFET TECHNOLOGY

FIELD OF THE INVENTION

The present invention relates to fin field effect transistor (FINFET) devices and more particularly, to techniques for quantifying fin thickness variation (ΔDfin) in FINFET technology.

BACKGROUND OF THE INVENTION

The short channel behaviors of fin field effect transistors (FINFETs) are controlled by fin thickness due to the fully depleted nature of the devices. Short channel behaviors and fin thickness (Dfin) in FINFET devices are described, for example, in Chung-Hsun Lin et al., "Non-Planar Device Architecture for 15 nm Node: FinFET or Trigate?," 2010 IEEE International SOI Conference (SOI), pgs. 1-2, Oct., 2010. Thus, control over fin thickness variations is important to achieve a viable technology.

Conventional approaches for quantifying fin thickness variation include top-down scanning electron micrograph (SEM) analysis or physical analysis of a transmission electron micrograph (TEM) cross-section cut. Unfortunately, both of these processes can be very time consuming and destroy the wafer.

Thus, efficient techniques for quantifying fin thickness variation in FINFET devices that do not damage the wafer would be desirable.

SUMMARY OF THE INVENTION

The present invention provides techniques for quantifying fin thickness variation (ΔDfin) in FINFET technology. In one aspect of the invention, a method for quantifying ΔDfin between a pair of long channel FINFET devices is provided. The method includes the steps of: (a) obtaining threshold voltage (Vth) values for each of the long channel FINFET devices in the pair; (b) determining a difference in the Vth values (ΔVth) for the pair of long channel FINFET devices; and (c) using the ΔVth to determine the ΔDfin between the pair of long channel FINFET devices, wherein the ΔVth is a function of a difference in a body charge (Qbody) and a gate capacitance between the pair of long channel FINFET devices, and wherein the Qbody is a function of fin thickness (Dfin) and channel doping concentration (Nch) for each of the of the long channel FINFET devices in the pair, and as such the ΔVth is proportional to the ΔDfin between the pair of long channel FINFET devices.

In another aspect of the invention, a method for optimizing a FINFET fabrication process is provided. The method includes the steps of: quantifying fin thickness variation (ΔDfin) between a pair of long channel FINFET devices; determining whether the ΔDfin is less than a specified ΔDfin value; and changing one or more parameters of the fabrication process if the ΔDfin is greater than the specified ΔDfin value and repeating the quantifying and determining steps, otherwise considering the fabrication process optimized if the ΔDfin is less than the specified ΔDfin value. The ΔDfin between the pair of long channel FINFET devices is quantified by (a) obtaining threshold voltage (Vth) values for each of the long channel FINFET devices in the pair; (b) determining a difference in the Vth values (ΔVth) for the pair of long channel FINFET devices, and (c) using the ΔVth to determine the ΔDfin between the pair of long channel FINFET devices, wherein the ΔVth is a function of a difference in a body charge (Qbody) and a gate capacitance between the pair of long channel FINFET devices, and wherein the Qbody is a function of fin thickness (Dfin) and channel doping concentration (Nch) for each of the long channel FINFET devices in the pair, and as such the ΔVth is proportional to the ΔDfin between the pair of long channel FINFET devices.

A more complete understanding of the present invention, as well as further features and advantages of the present invention, will be obtained by reference to the following detailed description and drawings.

BRIEF DESCRIPTION OF THE DRAWINGS

FIG. 11 is a diagram illustrating an exemplary methodology for use of the present ΔDfin evaluation techniques to optimize a FINFET fabrication process according to an embodiment of the present invention; and FIG. 12 is a diagram illustrating an exemplary apparatus for performing one or more of the methodologies presented herein according to an embodiment of the present invention.

DETAILED DESCRIPTION OF PREFERRED EMBODIMENTS

Figure 1:
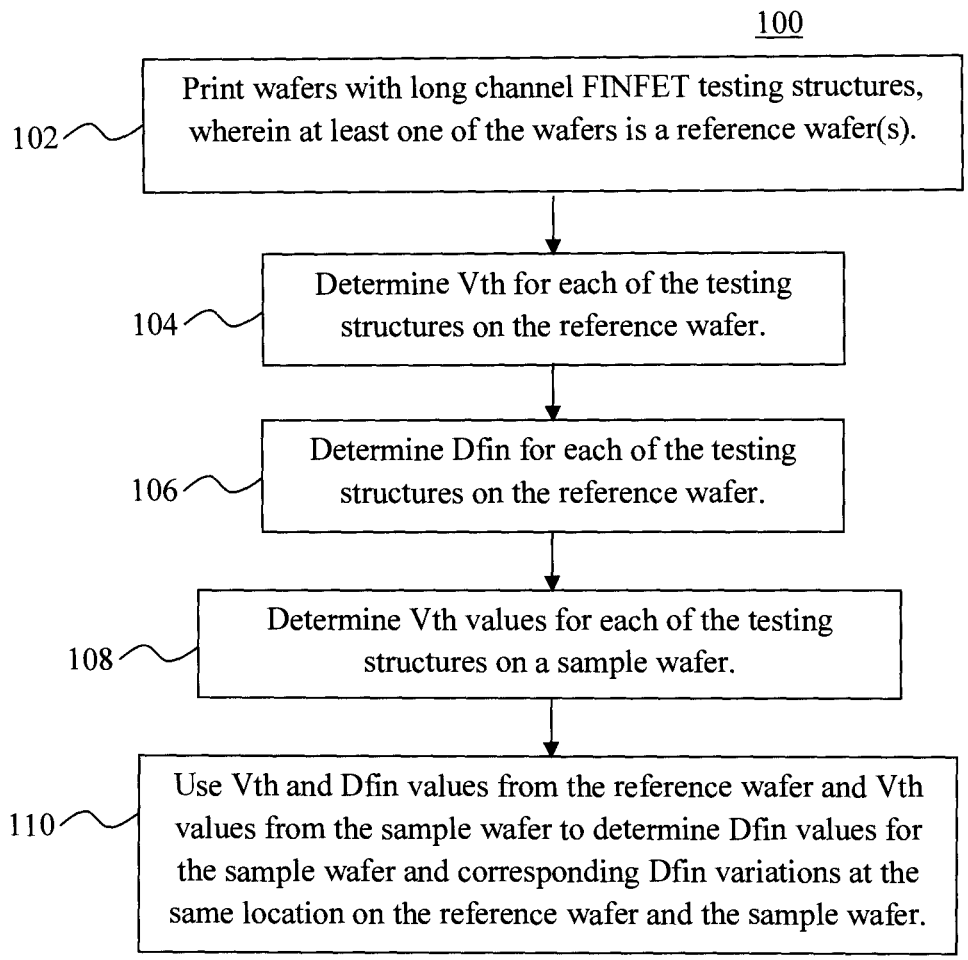
FIG. 1 is a diagram illustrating an exemplary methodology for quantifying global variations on a wafer using the present techniques according to an embodiment of the present invention.

Provided herein are techniques for systematically and efficiently quantifying FIN field effect transistor (FINFET) fin thickness (Dfin) variations (ΔDfin) across a chip without causing damage to the wafer. The present techniques make use of the discovery that the difference in threshold voltage (Vth)–ΔVth—between pairs of long channel FINFET devices is proportional to the difference in fin thickness (Dfin)–ΔDfin—between these devices (also referred to herein as fin thickness variation). This relationship can then be used to quantify long channel FINFET ΔDfin for any sample wafer based on Vth values for at least two long channel FINFET devices on the wafer. The present techniques can be implemented to analyze systematic/global processing fin thickness variations (ΔDfin), as well as local/random fin thickness variations (ΔDfin) that occur on the wafer. Systematic/global variations are variations that occur on a wafer-by-wafer basis, and are typically caused by variations in the manufacturing process. For instance, the particular lithography tool being used may have a slight distortion. Thus, all of the wafers printed using this tool will experience the same variations. Local variations, on the other hand, are variations that occur (potentially randomly) within a particular wafer. The present techniques can be employed to analyze/quantify and reduce global and/or local ΔDfin. For instance, once the global and/or local ΔDfin is quantified, the present evaluation process can be repeated in an iterative fashion while adjusting one or more process parameters—with the goal being to decrease variability for a given process.

According to an exemplary embodiment, the present techniques employ one or more FINFET test structures. Each test structure includes two long channel FINFETs (i.e., a FINFET pair) connected in series or in parallel. A long channel FINFET, as known to those in the art, is a transistor with a sufficiently large enough length and width that edge effects can be neglected. For example, any device with a length greater than or equal to about 100 nm is considered herein to be a long channel transistor. The channel length in a long channel transistor is greater than the sum of the source and drain depletion widths. In a long channel transistor the threshold voltage is independent of channel length and width.

As will be described in detail below, it is preferable that one of the long channel FINFETs in the testing structure pair is doped and the other is undoped. This doped/undoped pair configuration is used to insure a ΔVth between the FINFETs in the testing structure pair. Namely, as highlighted above, and as will be described in detail below, the testing structures may be used to quantify local variations. Since the FINFET devices in each of the testing structure pairs are located adjacent to one another on the wafer (e.g., such that they can be controlled by a common gate electrode—see below), it is assumed that fin thickness variations (ΔDfin) between the devices in any given testing structure pair are at best minimal. Thus in order to have a measurable and discernible ΔVth between the devices in each testing structure pair doping is used.

Systematic/Global fin thickness variations—as described above, the present techniques may be used to quantify global fin thickness variations (ΔDfin) that occur on a wafer-by-wafer basis. As explained above, these global fin thickness variations occur based, e.g., on variations in the lithographic tooling being used, and oftentimes are consistent from one wafer to another.

FIG. 1 is a diagram illustrating an exemplary methodology 100 for quantifying global fin thickness variations (ΔDfin) on a wafer using the present techniques. In step 102, a given circuit layout is printed onto each of a plurality of wafers. In order to ascertain global (wafer-to-wafer) variations, it is preferable that the same processing parameters and equipment are used to print all of the wafers in step 102. As is known in the art, wafer printing processing parameters which can affect device characteristics (such as fin thickness) include, for example, focus and dose. See for example A. Borna et al., "Correlation analysis of CD-variation and circuit performance under multiple sources of variability," Proceedings of SPIE vol. 5756, Design and Process Integration for Microelectronic Manufacturing III, 168 (May 13, 2005), the contents of which are incorporated by reference herein.

The circuit layout printed in step 102 is application specific, and will vary depending on the particular circuits being fabricated. However, since the present techniques are directed to ascertaining fin thickness variations (ΔDfin) in long channel FINFET devices, it is preferable that the circuit layout includes long channel FINFET devices. Further, according to an exemplary embodiment, the circuit layout includes multiple pairs of the above-described FINFET testing structures in predetermined locations—such that when the circuit layout is printed on a wafer, the testing structures will be present at multiple (predetermined) locations on the wafer. Thus, according to an exemplary embodiment, at least some of the long channel FINFET devices printed on the wafer make up the present testing structure set forth herein.

By way of example only, the number (i.e., number of sampling points) and location (locations from which to sample) of the testing structure pairs on the wafer can be determined using the techniques provided in U.S. Patent Application Publication Number 2010/0249974 filed by Fei et al., entitled "Advanced Process Control With Novel Sampling Policy" (hereinafter "U.S. Patent Application Publication Number 2010/0249974") the contents of which are incorporated by reference herein, which describes using residual standard error (RSE) to determine the number of sampling points and then using standard deviation to determine the position of the sampling points; and/or the techniques described in J. P. Cain et al., "Optimum sampling for characterization of systematic variation in photolithography," Proc. SPIE 4689, Metrology, Inspection, and Process Control for Microlithography XVI, 430 (Jul. 1, 2002) (hereinafter "Cain"), the contents of which are incorporated by reference herein, which describe an optimum sampling plan that can be employed to analyze the variations in a process performed on a wafer over time. Use of the placement techniques in U.S. Patent Application Publication Number 2010/0249974 and/or Cain will insure an adequate sampling of data across the wafer. Further, since it is preferable for the circuit layout to be printed in a repetitive manner on multiple wafers, according to an exemplary embodiment, each of the wafers printed in step 102 has the same number of testing structures in the same (predetermined) locations on the wafer.

Taking one (or more) of the printed wafers as a reference (also referred to herein as a reference wafer), in step 104, the Vth is determined for one or more of the long channel FINFETS on the reference wafer. As provided above, the circuit layout preferable includes multiple pairs of the above-described FINFET testing structures. Thus, while in step 104 it is possible to determine the Vth for all of the long channel FINFETS printed on the reference wafer, for ease of analysis it is also possible to take a sampling from different points on the wafer. As provided above, the circuit layout may be configured such that the testing structure pairs are present at multiple sampling points (at predetermined locations) on the wafer. Thus, according to an exemplary embodiment, Vth values are obtained from only the testing structures on the wafer. This will provide a representative sampling of Vth values at the (predetermined) sampling points across the wafer. Further, since i) the fin thickness variations being analyzed here are global, and ii) it is not expected that there will be major fin thickness variation between the FINFET devices in a given testing structure pair, then Vth analysis of only one FINFET device in each testing structure pair is needed. However, when the testing structure pairs each include both a doped and an undoped device, then consistent sampling from either all of the doped or all of the undoped devices should be done as mixing Vth readings from doped and undoped devices might alter the analysis. According to an exemplary embodiment, in order to extrapolate the data obtained from the reference wafer to other (non-testing structure) long channel FINFET devices on other wafers, wherein the other long channel FINFET devices are likely doped, it is preferable to sample Vth readings from only the doped FINFET device in each of the testing structure pairs. Reference to Equations 1-3 below will reveal that in the case where only the doped devices are sampled for global variation analysis, then any ΔVth detected is attributable to fin thickness variation.

An exemplary process for extracting FINFET Vth from the Vth of the (undoped) FINFET, the body charge, and the gate capacitance is provided below. For a review of other possible Vth extraction methods that may be used in accordance with the present techniques see, for example, A. Ortiz-Conde et al., "A review of recent MOSFET threshold voltage extraction methods," Microelectronics Reliability 42, pgs. 583-596 (Apr., 2002) (hereinafter "Ortiz-Conde"), the entire contents of which are incorporated by reference herein. See also, V. Narendar et al., "Threshold Voltage Control Schemes in FINFETS," International Journal of VLSI design & Communication Systems (VLSICS), Vol. 3, No. 2, Apr. 2012 and in M. Zakir Hossain et al., "Electrical Characteristics Of Trigate Finfet," Global Journal of Researches in Engineering, Electrical and Electronics Engineering, Volume 11, Issue 7, Version 1.0, Dec. 2011, the entire contents of each of which are incorporated by reference herein.

In step 106, the fin thickness (Dfin) is determined for each of the long channel FINFET devices on the reference wafer for which Vth data was extracted in step 104. As described above, this could be all of the long channel FINFET devices on the reference wafer, or a sampling—e.g., from the doped long channel FINFET device in each testing structure pair. Again, this will provide a representative sampling of Dfin values at the (predetermined) sampling points across the wafer.

The Dfin measurement in step 106 may be performed using standard techniques, such as top-down scanning electron micrograph (SEM) analysis or physical analysis of a transmission electron micrograph (TEM) cross-section cut. As described above, these processes however can destroy the wafer. Advantageously, according to the present techniques, the SEM or TEM analysis of Dfin needs to be performed only on the reference wafer. Any of the other wafers printed in step 102 can be analyzed using the data extracted from the reference wafer without being damaged—see below.

As a result of performing steps 104 and 106, both the Vth and Dfin values are known for long channel FINFET devices at multiple sampling points on the reference wafer. According to an exemplary embodiment, the sampling points are at predetermined locations in the circuit layout—as described above.

As described above, it has been discovered herein that the ΔVth between two long channel FINFET devices is directly proportional to the ΔDfin between those devices. This relationship between ΔVth and ΔDfin in long channel FINFET devices can be captured as follows. First, as shown in Equation 1 immediately below, the Vth of a long channel FINFET (doped or undoped) is a function of the Vth of the FINFET (undoped), body charge, and gate capacitance:

$$\text{Long Channel FINFET } Vth = \text{Undoped Long Channel FINFET } Vth + Q\text{body}/Cox, \quad (1)$$

wherein Qbody is body charge and Cox is gate capacitance. Further, $$Q\text{body} \sim q*D\text{fin}/2*N\text{ch}, \quad (2)$$

wherein q is the elementary electron charge in silicon (i.e., about 1.6e-19 Coul) and Nch is the channel doping concentration.

$$\text{Undoped Long channel FINFET } Vth \sim \Delta\phi_i + E_g/2_q$$
$$(\text{where } \Delta\phi_i \text{ is } WF - E_i(\text{Si}) ),$$

wherein $\Delta\phi_i$ is the difference between metal work function (WF) and semiconductor (silicon (Si)) intrinsic Fermi level ($E_i$), $E_g$ is band gap, WF is work function, $E_i$ is intrinsic Fermi level and Si is silicon. Thus the ΔVth between two long channel transistors is directly proportional to the ΔDfin between those transistors:

$$\Delta Vth \sim \Delta Q\text{body}/Cox \propto \Delta D\text{fin}. \quad (3)$$

All of the variables in the Equations 1-3 above, except for Dfin, can be easily extracted/measured experimentally by one skilled in the art without affecting the sample wafer. Thus, these are considered known variables in the instant process. Dfin, on the other hand, is considered herein to be an unknown variable. As described above, determining Dfin by conventional methods would involve imaging analysis that can damage the wafer. Advantageously, by way of the present techniques, Dfin can be calculated based on Vth data, without damaging the wafer under analysis.

To analyze global fin thickness variations, one can take any sample wafer produced using the same production process (i.e., same lithography equipment, same process parameters, etc.) as the reference wafer, and in step 108 measure the Vth of multiple long channel FINFET devices on the sample wafer. As provided above, the sample wafer (e.g., one of the multiple wafers printed with the given circuit layout in step 102) may have the present FINFET testing structure pairs at predetermined locations on the wafer. In that case, in step 108 the Vth data would be obtained from the FINFETs in the testing pairs on the sample wafer. As also provided above, consistent sampling from either the doped or undoped testing structure in the pair is preferable for consistency. Thus, if Vth and Dfin data was obtained for the doped devices in the FINFET testing structure pairs at each of the predetermined locations on the reference wafer, then in step 108 the Vth dat would in the same manner be extracted for the doped devices in the FINFET testing structure pairs at each of the same predetermined locations on the sample wafer. The Dfin data for the sample wafer is however yet unknown for the sample wafer, but can be easily determined using the present techniques.

Namely, based on Equations 1-3 above, in step 110 the Vth data extracted from the sample wafer along with the Vth and Dfin data that has already been determined for the reference wafer—see above—can then be used to calculate a ΔDfin for each predetermined location on the reference and sample wafers. Specifically, according to Equations 1-3 and as described above, the only unknown variable is Dfin. Both Vth and Dfin are known for each (predetermined) location on the reference wafer (wherein Dfin was determined experimentally—see above). Vth is known for each of the same (predetermined) locations on the sample wafer. Thus, Equation 3 above can be used to determine the Dfin at each location on the sample wafer. Once the Dfin is known for each of the (predetermined) locations on the sample wafer it is a simple exercise to compare the Dfin at the same location on the reference and sample wafers to determine the ΔDfin, if any, between the two wafers at that location. This variation is the global (wafer-to-wafer) variation being analyzed.

It is notable that according to the present techniques evaluation of the ΔVth/ΔDfin occurs in a pair-wise manner wherein FINFETs are analyzed in pairs, whether it be to determine global variations on the wafer or local/random variations. Specifically, Vth values are determined for two different long channel FINFET devices, and those values are compared to determine a ΔVt between the devices. In the case where global variation is being studied, as described in detail above, the two (pair of) FINFETs being analyzed may be located on different wafers. By comparison, in the case where local/random variation is being analyzed, the two (pair of) FINFETs being analyzed might be the two FINFETs that make up one of the present testing structure pairs, and thus are located right next to (i.e., adjacent to) one another on the wafer.

Figure 2:
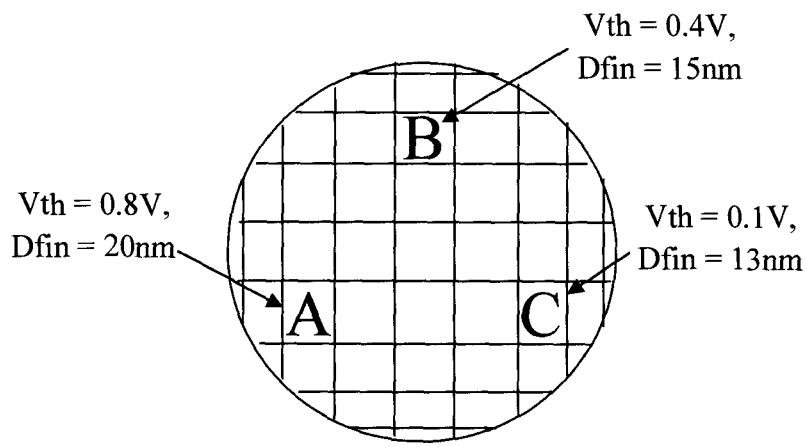
FIG. 2 is a diagram illustrating an exemplary reference wafer according to an embodiment of the present invention.

Methodology 100 is further illustrated by way of reference to the following simple, non-limiting example. For instance, assume that Vth and Dfin data are obtained from three (predetermined) sampling points A, B, and C on the reference wafer. In practice, a greater number of sampling points would likely be used, however for ease and clarity of description the present example uses only three points. See FIG. 2. The sample wafers, printed with the same circuit layout as the reference wafer, would have testing structures at the same sampling points A, B, and C and Vth can be extracted from the sample wafer at those sampling points. Using Equations 1-3 above, the Dfin can then be easily determined at each of the sampling points on the sample wafer using the process described above given the Vth and Dfin data from the reference wafer at those points. Any difference in the Dfin from the reference wafer and the sample wafer at a given one of the locations is the global fin thickness variation. By way of example only, the ΔDfin at sampling location A between the reference wafer ($Dfin_{A-ref}$) and the sample wafer ($Dfin_{A-sample}$) may be quantified as $|Dfin_{A-ref} - Dfin_{B-sample}|$.

Advantageously, Dfin variations can be quantified for any number of sample wafers using the present techniques simply by comparing the extracted Vth values for the sample with the Vth and Dfin data from the reference wafer. Thus, as compared with conventional analyses, the wafers being tested remain unaffected by the testing process.

Random/Local variations—as described above, the present techniques may also be used to quantify local variations that occur within a given wafer, i.e., also referred to herein as intra-wafer variations. As explained above, these local variations can occur randomly on a wafer and thus typically vary from one wafer to another. Thus, making a comparison of two wafers (for example a reference and a sample wafer as described above) might not give much insight into intra-wafer/local variations.

For this component of the analysis, both FINFETs in the above-described testing structure pair are employed. As described above, each FINFET pair consists of two FINFET devices arranged either in series or in parallel adjacent to one another at multiple positions on the wafer. Since the FINFET devices in a given one of the testing structure pairs are located right next to (i.e., adjacent to) one another (see below) on the wafer, it is assumed that variations (e.g., fin thickness variations) between the devices in the pair is, at most, minimal. Thus, in order to be able to extract a ΔVth between the devices in a pair it is preferable that one of the FINFET devices in the testing pair is doped and the other is undoped. See above. It is notable however, that use of a doped/undoped pair as the testing structure is only merely an example. For instance, the present techniques are equally applicable to scenarios involving pairs of doped FINFET devices in the same manner as described herein—as long as there is a ΔVth between the devices in the pair.

Figure 3:
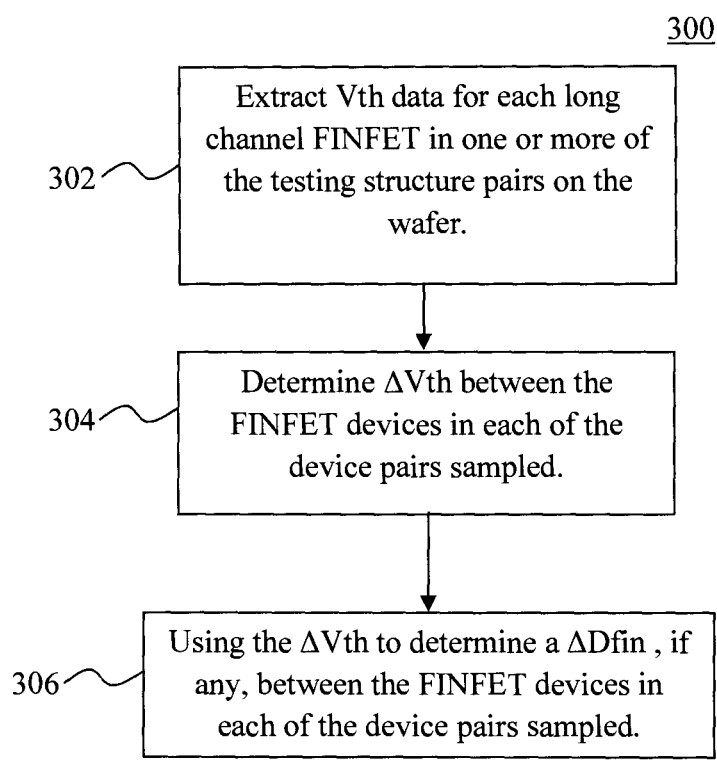
FIG. 3 is a diagram illustrating an exemplary methodology for quantifying local/random variations on a wafer using the present techniques according to an embodiment of the present invention.

FIG. 3 is a diagram illustrating an exemplary methodology 300 for quantifying local/random variations on a wafer using the present techniques. According to an exemplary embodiment, the wafer being analyzed is prepared as described, for example, in accordance with the description of step 102 of FIG. 1, above. By way of example only, methodology 300 may be employed to analyze local fin thickness variations in one of the sample wafers from methodology 100 described above. Namely, according to an exemplary embodiment the wafer is printed with a circuit layout having the present FINFET testing structures at multiple (predetermined) sampling points on the wafer. See above.

In step 302, Vth values are extracted for each FINFET device (i.e., both the doped and undoped device in the pair) in one or more of the testing structure pairs on the wafer. According to an exemplary embodiment, the Vth data is extracted in this step for all of the testing structure pairs on the wafer.

Based on the Vth data obtained in step 302, in step 304 a ΔVth is determined for each of the testing structure pairs being examined. As highlighted above, employing a doped/undoped testing structure pair can insure a ΔVth even when at most minimal fin thickness variation is present between the devices in a testing structure pair. See for example Equation 3, above. Namely, doping will increase the Vth of n-channel FINFET devices and decrease the Vth of p-channel FINFET devices, as compared to undoped devices of the same structure.

For a given one of the testing structure pairs on the wafer consisting of a doped long channel FINFET and an undoped long channel FINFET, the ΔVth between these pairs of FINFETs can be determined as the absolute value of the Vth of the doped device less the Vth of the undoped device, i.e., $|Vth_{doped} - Vth_{undoped}|$. In order to ascertain local variations across the wafer, it is preferable to at this step sample multiple pairs of devices. This aspect of sampling will be described in detail below.

As shown in Equations 1-3 above, it has been discovered herein that the ΔVth between two long channel FINFET transistors is directly proportional to the ΔDfin between those transistors. Namely, as provided above, the only unknown variable in Equations 1-3 is Dfin. Thus, given the In Equations 1-3, as described above, the only unknown variable is fin thickness. Thus in step 306, given the ΔVth data from step 304, the ΔDfin between the two FINFET devices (doped and undoped) in each testing structure pair can be easily determined. In the instance where there is no fin thickness variation between the devices in a testing structure pair, then the ΔVth between the pair of devices will be equivalent to differences in the channel doping concentration (and possibly gate capacitance) between the devices—both of which are known.

As will be described in detail below, the ΔDfin values for multiple locations across the chip/wafer can be determined in the manner described above in order to ascertain process variations. Further, since the goal is ultimately to reduce the ΔDfin as much as possible, the present techniques can be employed in an iterative manner to insure that the output falls within production specifications. Specifically, the present techniques may be employed to determine ΔDfin distributions for a given set of process parameters. Changes to the process parameters can be made (with an eye towards reducing variability). The present evaluation process can again be conducted, and the results from each run compared to determine what impact the process parameter changes had on fin thickness variability.

Figure 4:
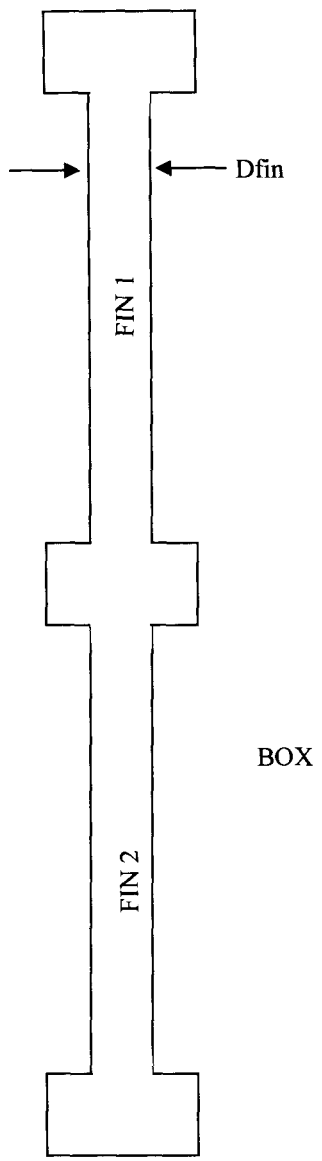
FIG. 4 is a top-down diagram illustrating a pair of fins (FIN 1 and FIN 2) having been patterned in a silicon-on-insulator (SOI) wafer in series according to an embodiment of the present invention.
Figure 5:
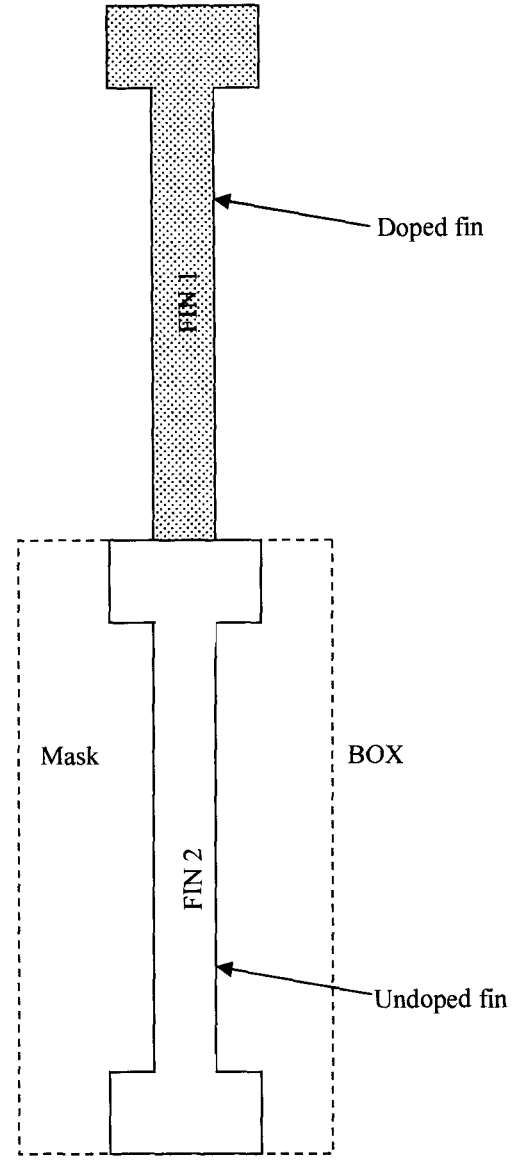
FIG. 5 is a top-down diagram illustrating one of the pair of fins (in series) having been selectively doped according to an embodiment of the present invention.
Figure 6:
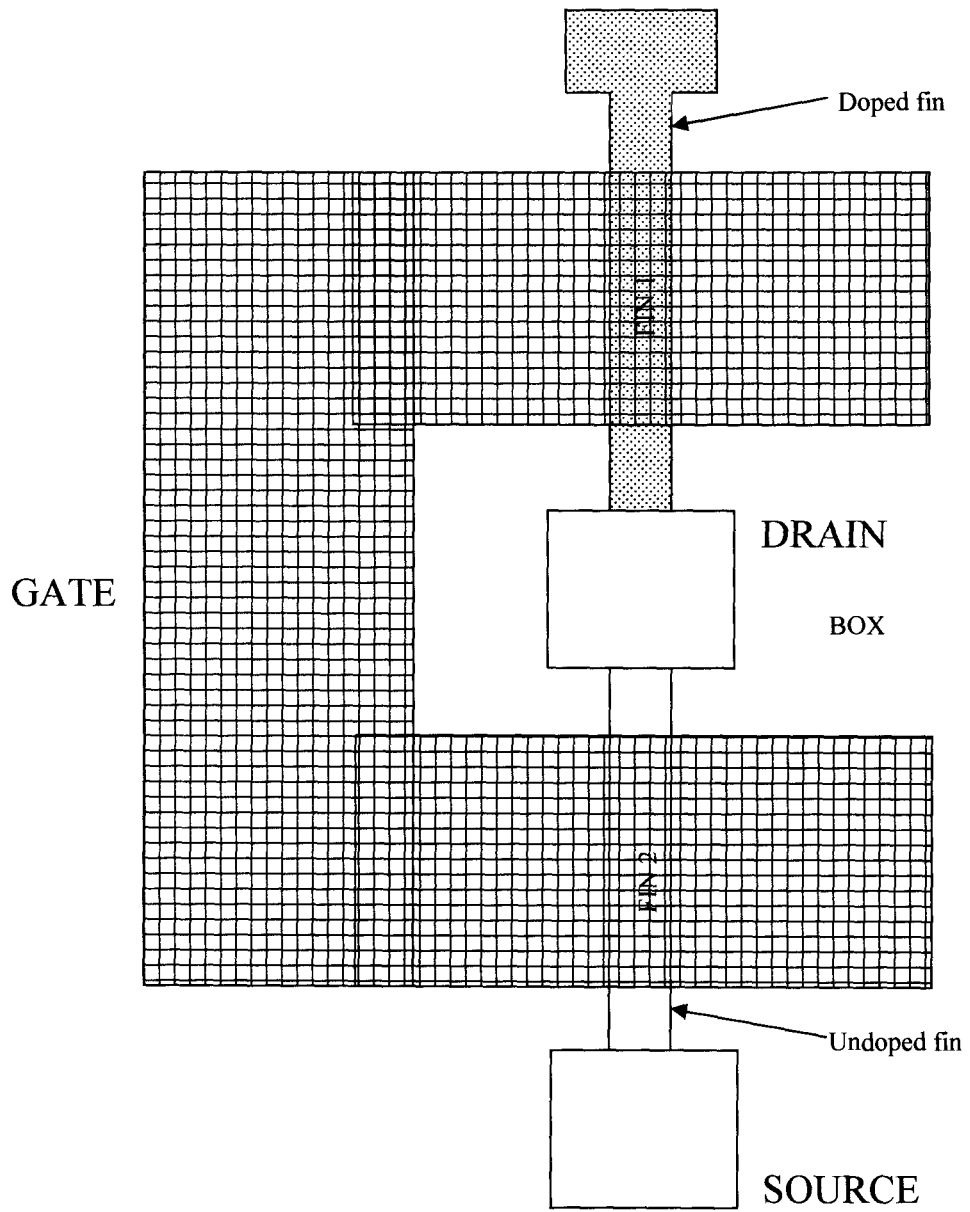
FIG. 6 is a top-down diagram illustrating a gate electrode and source/drain electrodes having been formed according to an embodiment of the present invention.

As provided above, the present evaluation process employs pairs of long channel FINFET devices, for example, one doped and one undoped, formed adjacent to one another (and connected either in series or in parallel) on a wafer. While a number of different device configurations are possible, FIGS. 4-6 provide one exemplary process for fabricating a pair of transistors (e.g., one doped and one undoped in series) on a wafer, that may be used in accordance with the present techniques. This is merely one exemplary embodiment.

As shown in FIG. 4, a pair of fins (including, e.g., FIN 1 and FIN 2) is fabricated on a wafer. According to an exemplary embodiment, the wafer is a silicon-on-insulator (SOI) wafer, having a SOI layer separated from a substrate by a buried oxide or BOX, and the fins (FIN 1 and FIN 2) are patterned in the SOI layer in series. In the top-down depictions shown in the drawings, the fins (FIN 1 and FIN 2) (patterned in the SOI layer) and the underlying BOX are visible.

As highlighted above, the FINFET devices in a given test structure pair are located adjacent and in close proximity to one another on the wafer such that any fin thickness variation between the devices in a given testing pair are considered to be due to local/random variation. In this example, the two devices are formed in series on the wafer.

Conventional lithography and etching techniques may be employed to pattern the pair of fins on the wafer. By way of example only, a hardmask may be formed on the wafer with the footprint and location of the fins, and a suitable reactive ion etching (RIE) chemistry through the hardmask can be used to pattern the fins in the SOI layer. The fin thickness dimension (Dfin) is shown labeled in FIG. 4.

Next, as shown in FIG. 5, one of the fins is selectively doped (in this case FIN 1 is arbitrarily chosen for doping). Selectively doping one of the fins can be accomplished by masking the other fins, for example, using a resist mask—see FIG. 5, doping the unmasked fin and then removing the resist mask. Suitable p-type dopants include, but are not limited to, boron. Suitable n-type dopants include, but are not limited to, phosphorous and arsenic. As provided above, one of the long channel FINFET devices is doped to insure a $\Delta$Vth between the devices in the (doped/undoped) pair. Doping will increase the Vth of n-channel devices and decrease the Vth of p-channel devices, i.e., as compared to undoped devices having the same structure.

Finally, a gate electrode and source/drain electrodes are formed. See FIG. 6. As shown in FIG. 6, a single, shared split gate electrode is used in this example which is common to the pair of FINFET devices. The gate electrode can be formed, for example, from a metal(s) and/or doped polysilicon that is/are blanket deposited and then patterned to form the gate line. Separate source and drain contacts are formed for each FINFET device. The source and drain contacts may be formed, for example using a silicidation process.

The fin pairs might also be configured in parallel. See, for example, FIGS. 7-9 which provide another exemplary process for fabricating a pair of transistors (one doped and one undoped—in this case in parallel) on a wafer, that may be used in accordance with the present techniques. Again this is merely one exemplary embodiment.

Figure 7:
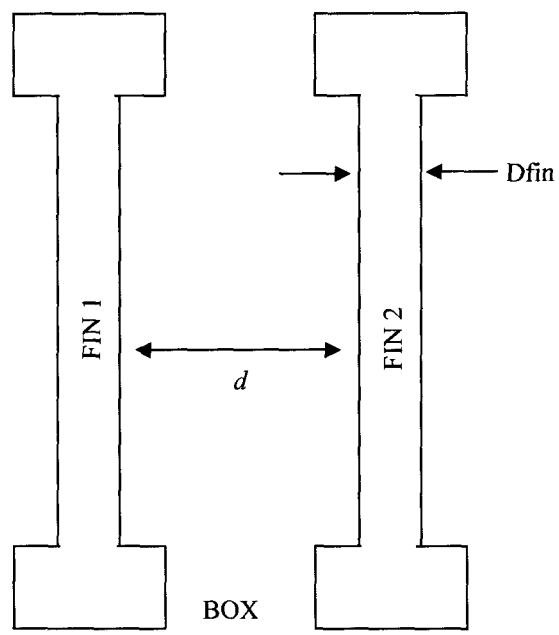
FIG. 7 is a top-down diagram illustrating a pair of fins (FIN 1 and FIN 2) having been patterned in a SOI wafer in parallel according to an embodiment of the present invention.

As shown in FIG. 7, a pair of fins (including FIN 1 and FIN 2) is fabricated on a wafer. According to an exemplary embodiment, the wafer is a SOI wafer, having a SOI layer separated from a substrate by a BOX, and the fins (FIN 1 and FIN 2) are patterned in the SOI layer in parallel. In the top-down depictions shown in the drawings, the fins (FIN 1 and FIN 2) (patterned in the SOI layer) and the underlying BOX are visible.

As highlighted above, the FINFET devices in a given test structure pair are located adjacent and in close proximity to one another on the wafer such that any fin thickness variation between the devices in a given testing pair are considered to be due to local/random variation. In this example, the two devices are located on the wafer at a distance d from one another. According to an exemplary embodiment, d is less than or equal to about 20 nm, e.g., less than or equal to about 10 nm.

Conventional lithography and etching techniques may be employed to pattern the pair of fins on the wafer. By way of example only, a hardmask may be formed on the wafer with the footprint and location of the fins, and a suitable reactive ion etching (RIE) chemistry through the hardmask can be used to pattern the fins in the SOI layer. The fin thickness dimension (Dfin) is shown labeled in FIG. 7.

Figure 8:
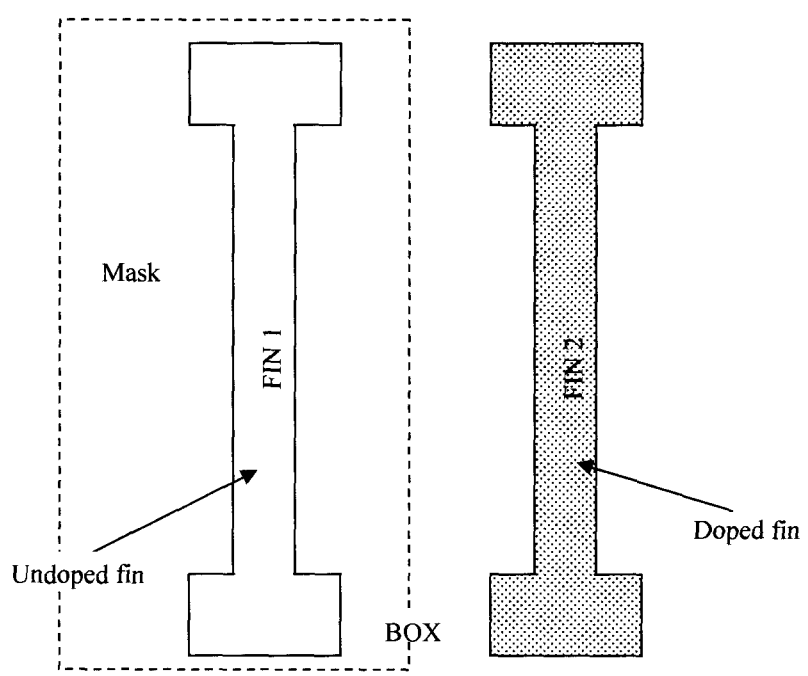
FIG. 8 is a top-down diagram illustrating one of the pair of fins (in parallel) having been selectively doped according to an embodiment of the present invention.

Next, as shown in FIG. 8, one of the fins is selectively doped (in this case FIN 2 is arbitrarily chosen for doping). Selectively doping one of the fins can be accomplished by masking the other fins, for example, using a resist mask—see FIG. 8, doping the unmasked fin and then removing the resist mask. Suitable p-type dopants include, but are not limited to, boron. Suitable n-type dopants include, but are not limited to, phosphorous and arsenic. As provided above, one of the long channel FINFET devices is doped to insure a $\Delta$Vth between the devices in the (doped/undoped) pair. Doping will increase the Vth of n-channel devices and decrease the Vth of p-channel devices, i.e., as compared to undoped devices having the same structure.

Figure 9:
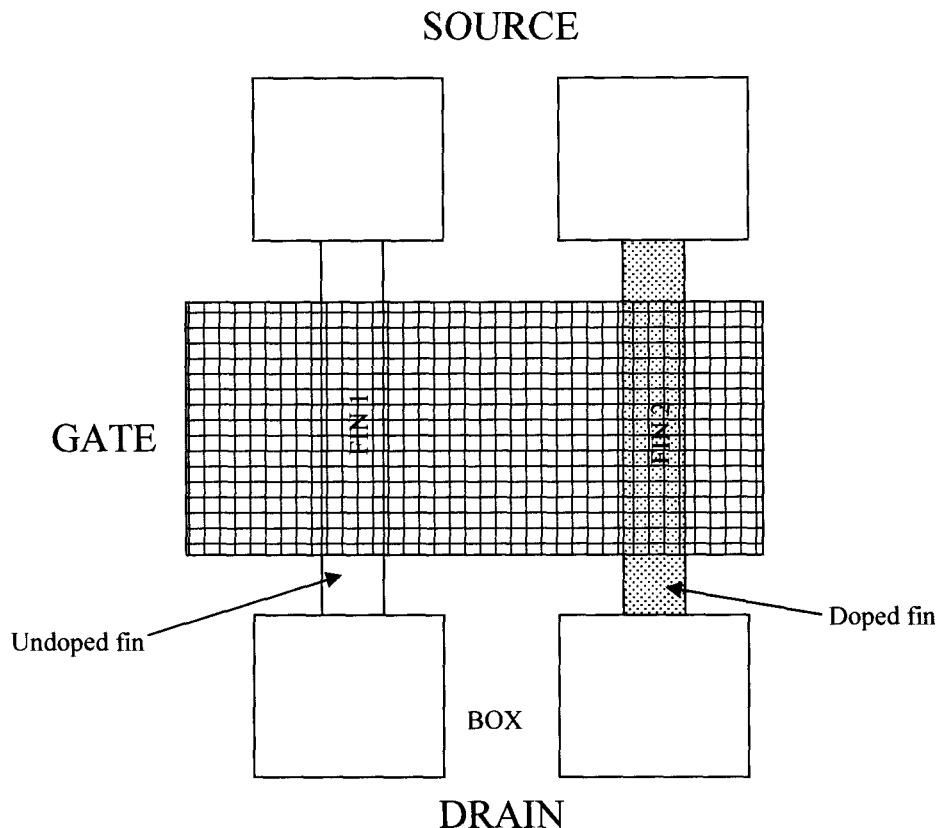
FIG. 9 is a top-down diagram illustrating a gate electrode and source/drain electrodes having been formed according to an embodiment of the present invention.

Finally, a gate electrode and source/drain electrodes are formed. See FIG. 9. As shown in FIG. 9, a single gate electrode is used in this example which is common to the pair of FINFET devices. The gate electrode can be formed, for example, from a metal(s) and/or doped polysilicon that is/are blanket deposited and then patterned to form the gate line. Separate source and drain contacts are formed for each FINFET device. The source and drain contacts may be formed, for example using a silicidation process.

As provided above, the present techniques may be used in a systematic fashion to determine a fin thickness distribution across a chip or even across an entire wafer. To do so, Vth readings need to be taken from multiple points (i.e., from multiple pairs of the present doped/undoped long channel FINFET devices located at various different locations on the wafer). Any suitable processes for determining optimum sampling points for a semiconductor wafer processing may be employed to place the (e.g., doped/undoped) long channel FINFET testing device pairs on the wafer and/or to select from which pairs of devices to take readings. By way of example only, U.S. Patent Application Publication Number 2010/0249974 filed by Fei et al., entitled "Advanced Process Control With Novel Sampling Policy," the contents of which are incorporated by reference herein describes using residual standard error (RSE) to determine the number of sampling points and then using standard deviation to determine the position of the sampling points. J. P. Cain et al., "Optimum sampling for characterization of systematic variation in photolithography," Proc. SPIE 4689, Metrology, Inspection, and Process Control for Microlithography XVI, 430 (Jul. 1, 2002), the contents of which are incorporated by reference herein, describes an optimum sampling plan that can be employed to analyze the variations in a process performed on a wafer over time.

Figure 10:
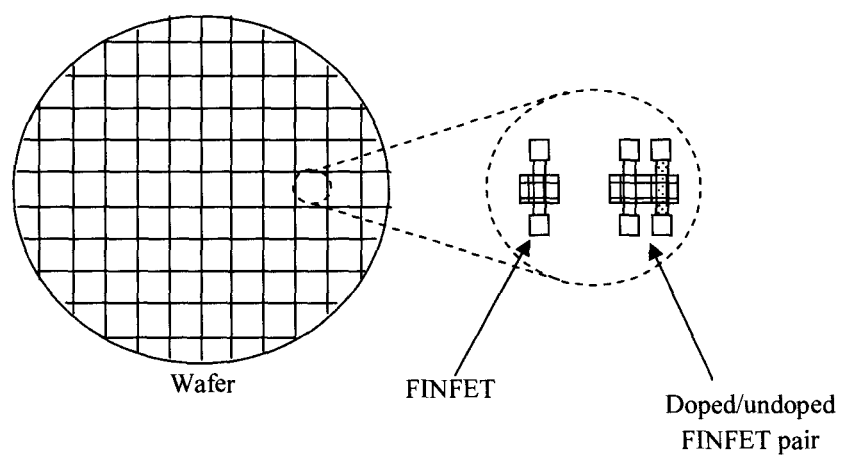
FIG. 10 is a schematic diagram illustrating use of the present doped/undoped FINFET devices as a "testing structure" alongside one or more other FINFET devices on a wafer according to an embodiment of the present invention.

According to one exemplary implementation, the present techniques are employed to evaluate fin thickness variation across a chip or wafer for a given FINFET processing technology by forming the above-described pair of (e.g., doped/undoped) FINFET devices as a "testing structure" alongside one or more other FINFET devices on a wafer. See, for example, FIG. 10. As shown in FIG. 10, an expanded view of a section of the wafer reveals that, in addition to the FINFET devices that are being manufactured on the wafer, a pair of the present doped/undoped FINFET devices are also formed on the wafer for use as a testing structure for evaluating/testing fin thickness variation. It is notable that the parallel fin configuration (see description of FIGS. 7-9, above) is arbitrarily being chosen as the testing structure in FIG. 10, and that the serial configuration (of FIGS. 4-6) can be employed in the same manner described. As will be described, for example, in conjunction with the description of FIG. 11 below, the steps of methodology 100/300 can be used to evaluate global/local fin thickness variation using the "testing structure." Then depending on whether the results are within specification, modifications to one or more processing parameters can be made followed by re-evaluation, and so on. The concept here is that if the intended FINFET devices and the testing structure are produced using the same process parameters, then the fin thickness variation determined using the testing structure will be representative of that found in the FINFET devices being manufactured on the wafer.

FIG. 11 is a diagram illustrating an exemplary methodology 1100 for use of the present ΔDfin evaluation techniques to optimize a FINFET fabrication process. In one exemplary implementation, as shown in FIG. 10, the above-described pair of doped/undoped FINFET devices are formed in multiple locations on the wafer as testing structures alongside one or more other FINFET devices being manufactured, the testing structures being used to evaluate fin thickness variation. In step 1102, the steps of methodology 100 and/or methodology 300 are performed to determine global/local ΔDfin for (preferably) multiple testing structures at multiple locations on the wafer. See above description regarding wafer sampling techniques. As provided above, the notion here is that since the same processing parameters are being used to fabricate the testing structures as the FINFET devices being manufactured, then the ΔDfin evaluated in the testing structures is representative of that in the FINFET devices for any given location on the wafer.

In step 1104, a determination is made as to whether the ΔDfin is within specifications. As described above, short channel behaviors of a FINFET device are controlled by fin thickness. Thus, for a given application, a specification as to how much fin thickness variation is acceptable can be set, for example, by a chip designer based on performance parameters, etc. The goal ultimately is to minimize ΔDfin as much as is possible.

If the ΔDfin is acceptable (within specifications) then the process is ended. For example, the chip designer might set a maximum value for ΔDfin. If the value obtained for ΔDfin at each of the locations sampled on the wafer does not exceed the maximum ΔDfin, then the wafer is considered to be within specifications.

On the other hand, if the ΔDfin is unacceptable (outside of specifications) then in step 1106 one or more processing parameters may be altered in an attempt to bring ΔDfin within specification. For example, if the value obtained for ΔDfin at one or more of the locations sampled on the wafer exceeds the maximum ΔDfin (set by the chip designer), then the wafer is considered to be outside of specifications. As shown in FIG. 11, the process can then be repeated in an iterative manner using the updated processing parameters until the devices are within spec.

It is within the capabilities of one skilled in the art to determine what processing parameter or parameters for a given fabrication technology can be altered to affect fin thickness variation. For instance, alterable lithographic parameters such as focus and dose can affect device characteristics. See for example A. Boma et al., "Correlation analysis of CD-variation and circuit performance under multiple sources of variability," Proceedings of SPIE vol. 5756, Design and Process Integration for Microelectronic Manufacturing III, 168 (May 13, 2005), the contents of which are incorporated by reference herein.

Alternatively, instead of employing the configuration shown in FIG. 10 (where the testing structures are produced alongside actual production FINFET devices on the wafer), only the testing structures themselves can be produced on the wafer. The steps of methodology 1100 can be performed using a given set of processing parameters, which can be altered as, and if, necessary to reduce the fin thickness variation to within specifications—in the same manner as described above. Once the processing parameters are optimized in this way, they can be used in the actual production of FINFET devices with the expectation that these optimized parameters will produce devices that are within production specs.

Turning now to FIG. 12, a block diagram is shown of an apparatus 1200 for implementing one or more of the methodologies presented herein. By way of example only, apparatus 1200 can be configured to implement one or more of the steps of methodology 100 of FIG. 1 for quantifying global fin thickness (Dfin) variations in long channel FINFET devices and/or methodology 300 of FIG. 3 for quantifying local fin thickness (Dfin) variations in long channel FINFET devices.

Apparatus 1200 comprises a computer system 1210 and removable media 1250. Computer system 1210 comprises a processor device 1220, a network interface 1225, a memory 1230, a media interface 1235 and an optional display 1240. Network interface 1225 allows computer system 1210 to connect to a network, while media interface 1235 allows computer system 1210 to interact with media, such as a hard drive or removable media 1250.

As is known in the art, the methods and apparatus discussed herein may be distributed as an article of manufacture that itself comprises a machine-readable medium containing one or more programs which when executed implement embodiments of the present invention. For instance, when apparatus 1200 is configured to implement one or more of the steps of methodology 100 and/or methodology 300 the machine-readable medium may contain a program configured to (a) obtain threshold voltage (Vth) values for each of the long channel FINFET devices in the pair; (b) determine a difference in the Vth values (ΔVth) for the pair of long channel FINFET devices; and (c) use the ΔVth to determine the ΔDfin between the pair of long channel FINFET devices, wherein the ΔVth is a function of a difference in a body charge (Qbody) and a gate capacitance between the pair of long channel FINFET devices, and wherein the Qbody is a function of fin thickness (Dfin) and channel doping concentration (Nch) for each of the long channel FINFET devices in the pair, and as such the ΔVth is proportional to the ΔDfin between the pair of long channel FINFET devices.

The machine-readable medium may be a recordable medium (e.g., floppy disks, hard drive, optical disks such as removable media 1250, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1220 can be configured to implement the methods, steps, and functions disclosed herein. The memory 1230 could be distributed or local and the processor device 1220 could be distributed or singular. The memory 1230 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1220. With this definition, information on a network, accessible through network interface 1225, is still within memory 1230 because the processor device 1220 can retrieve the information from the network. It should be noted that each distributed processor that makes up processor device 1220 generally contains its own addressable memory space. It should also be noted that some or all of computer system 1210 can be incorporated into an application-specific or general-use integrated circuit.

Optional display 1240 is any type of display suitable for interacting with a human user of apparatus 1200. Generally, display 1240 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for analyzing fin thickness variation ($\Delta$Dfin) between a pair of long channel FIN field-effect transistor (FINFET) devices, the method comprising the steps of:
   (a) obtaining threshold voltage (Vth) values for each of the long channel FINFET devices in the pair;
   (b) determining a difference in the Vth values ($\Delta$Vth) for the pair of long channel FINFET devices;
   (c) using the $\Delta$Vth to determine the $\Delta$Dfin between the pair of long channel FINFET devices, wherein the $\Delta$Vth is a function of a difference in a body charge (Qbody) and a gate capacitance between the pair of long channel FINFET devices, and wherein the Qbody is a function of fin thickness (Dfin) and channel doping concentration (Nch) for each of the long channel FINFET devices in the pair, and as such the $\Delta$Vth is proportional to the $\Delta$Dfin between the pair of long channel FINFET devices; and
   (d) based on the $\Delta$Dfin determined in step (c), repeating steps (a)-(c) while adjusting one or more process parameters to decrease the $\Delta$Dfin.

2. The method of claim 1, wherein the pair of long channel FINFET devices comprises one doped long channel FINFET device and one undoped long channel FINFET device.

3. The method of claim 2, wherein the doped long channel FINFET device and the undoped long channel FINFET device are connected in series.

4. The method of claim 2, wherein the doped long channel FINFET device and the undoped long channel FINFET device are connected in parallel.

5. The method of claim 2, wherein the doped long channel FINFET device and the undoped long channel FINFET device share a single, common gate electrode.

6. The method of claim 2, wherein the doped long channel FINFET device and the undoped long channel FINFET device are located adjacent to one another on a wafer.

7. The method of claim 6, wherein the doped long channel FINFET device and the undoped long channel FINFET device are located on the wafer at a distance d from one another, wherein d is less than or equal to about 20 nm.

8. The method of claim 1, wherein the steps (a)-(d) are performed for multiple pairs of long channel FINFET devices.

9. The method of claim 1, wherein the pair of long channel FINFET devices comprises a first long channel FINFET device at a given location on a reference wafer and a second long channel FINFET device at the given location on a sample wafer, the method further comprising the steps of:
   obtaining a Vth value and a Dfin value for the first long channel FINFET device on the reference wafer;
   obtaining a Vth value for the second long channel FINFET device on the sample wafer; and
   using the Vth and Dfin values for the first long channel FINFET device on the reference wafer and the Vth value for the second long channel FINFET device on the sample wafer to determine a Dfin value for the second long channel FINFET device on the sample wafer.

10. The method of claim 9, wherein the first long channel FINFET device and the second long channel FINFET device are doped.

11. The method of claim 9, wherein the Dfin value for the first long channel FINFET device on the reference wafer is obtained using scanning electron micrograph analysis or physical analysis of a transmission electron micrograph cross-section cut of the reference wafer.

12. A method for optimizing a FINFET fabrication process, the method comprising the steps of:
   quantifying fin thickness variation ($\Delta$Dfin) between a pair of long channel FINFET devices by (a) obtaining threshold voltage (Vth) values for each of the long channel FINFET devices in the pair; (b) determining a difference in the Vth values ($\Delta$Vth) for the pair of long channel FINFET devices, and (c) using the $\Delta$Vth to determine the $\Delta$Dfin between the pair of long channel FINFET devices, wherein the $\Delta$Vth is a function of a difference in a body charge (Qbody) and a gate capacitance between the pair of long channel FINFET devices, and wherein the Qbody is a function of fin thickness (Dfin) and channel doping concentration (Nch) for each of the long channel FINFET devices in the pair, and as such the $\Delta$Vth is proportional to the $\Delta$Dfin between the pair of long channel FINFET devices;
   comparing the $\Delta$Dfin with a specified $\Delta$Dfin value; and
   based on results from the comparing step, changing one or more parameters of the fabrication process and repeating the quantifying and comparing steps until the $\Delta$Dfin is less than the specified $\Delta$Dfin value.

13. The method of claim 12, wherein the parameters of the fabrication process comprise one or more of focus and dose.

14. The method of claim 12, wherein the pair of long channel FINFET devices comprises one doped long channel FINFET device and one undoped long channel FINFET device connected in series or in parallel.

15. The method of claim 14, wherein the doped long channel FINFET device and the undoped long channel FINFET device share a single, common gate electrode.

* * * * *